(12) United States Patent
Bowers et al.

(10) Patent No.: US 8,390,039 B2
(45) Date of Patent: Mar. 5, 2013

(54) JUNCTION FIELD EFFECT TRANSISTOR

(75) Inventors: Derek Frederick Bowers, Los Altos Hills, CA (US); Andrew David Bain, Limerick (IE); Paul Malachy Daly, Limerick (IE); Anne Maria Deignan, Limerick (IE); Michael Thomas Dunbar, San Jose, CA (US); Patrick Martin McGuinness, Limerick (IE); Bernard Patrick Stenson, Limerick (IE); William Allan Lane, Cork (IE)

(73) Assignee: Analog Devices, Inc., Norwood, MA (US)

( * ) Notice: Subject to any disclaimer, the term of this patent is extended or adjusted under 35 U.S.C. 154(b) by 614 days.

(21) Appl. No.: 12/611,055

(22) Filed: Nov. 2, 2009

(65) Prior Publication Data

US 2011/0101423 A1 May 5, 2011

(51) Int. Cl.
*H01L 29/80* (2006.01)
(52) U.S. Cl. .................. 257/256; 257/E29.312
(58) Field of Classification Search .................. 257/256, 257/272, E29.312, 408; 438/186, 196
See application file for complete search history.

(56) References Cited

U.S. PATENT DOCUMENTS

| | | | |
|---|---|---|---|
| 4,172,260 A * | 10/1979 | Okabe et al. .................. 257/409 |
| 4,337,473 A | 6/1982 | Nishizawa | |
| 4,452,646 A | 6/1984 | Zuleeg | |
| 4,648,174 A | 3/1987 | Temple et al. | |
| 5,418,392 A | 5/1995 | Tanabe | |
| 5,543,643 A | 8/1996 | Kapoor | |
| 5,631,176 A | 5/1997 | Kapoor | |
| 6,153,453 A | 11/2000 | Jimenez | |
| 7,495,347 B2 | 2/2009 | Raisanen et al. | |
| 7,994,535 B2 * | 8/2011 | Gunji et al. .................. 257/134 |
| 2004/0164379 A1 | 8/2004 | Raisanen et al. | |

FOREIGN PATENT DOCUMENTS

| | | |
|---|---|---|
| EP | 0660419 | 6/1995 |
| JP | 2000174035 | 6/2000 |
| WO | WO 2007/075759 A2 | 7/2007 |

OTHER PUBLICATIONS

International Search Report and Written Opinion dated Mar. 11, 2011 in Appl. No. PCT/US2010/055007, filed Nov. 1, 2010.
U.S. Appl. No. 12/611,052, filed Nov. 2, 2009.
Written Opinion mailed on Jan. 19, 2012 for International Application No. PCT/US2010/055007, filed on Nov. 1, 2010, 6 pages.
Stengl R. et al; "Variation of Lateral Doping—A New Concept to Avoid High Voltage Breakdown of Planar Junctions", International Electro Devices Meeting. Washington, Dec. 1-4, 1985; Washington, IEEE, US, vol. -, Jan. 12, 1985 pp. 154-157, XP002013050.

* cited by examiner

*Primary Examiner* — Mark Prenty
(74) *Attorney, Agent, or Firm* — Knobbe, Martens, Olson & Bear, LLP

(57) ABSTRACT

A field effect transistor having a drain, a gate and a source, where the drain and source are formed by semiconductor regions of a first type, and in which a further doped region is provided intermediate the gate and the drain. Field gradients around the drain are thereby reduced.

18 Claims, 12 Drawing Sheets

JUNCTION FIELD EFFECT TRANSISTOR

REFERENCE TO RELATED APPLICATION

This application is related to application Ser. No. 12/611,052, filed on even date herewith, entitled IMPROVED JUNCTION FIELD EFFECT TRANSISTOR.

FIELD OF THE INVENTION

The invention relates to an improved junction field effect transistor, and in particular to a way of reducing gate current.

BACKGROUND TO THE INVENTION

Junction field effect transistors, JFETs, can be fabricated using fabrication processes which are similar to, and compatible with, the processes used for the fabrication of bipolar transistors. For example a back gate (also known as bottom gate) of a JFET can be formed from the collector of a bipolar transistor. The drain and source are formed in the same fabrication step that is used to form the base region of the bipolar transistor.

JFETs can be formed as P channel or N channel devices. Ideally a FET would take no gate current. However real devices and especially N channel JFETs can enter regimes where the gate current rises significantly when the current density within the device is relatively large and the drain-source voltage of the device is relatively large. "Large" in this context varies from device to device and may only be a few volts or tens of volts.

SUMMARY OF THE INVENTION

According to a first aspect of the present invention there is provided an electronic device including a field effect transistor having a drain, a gate and a source, where the drain and source are formed by semiconductor regions of a first type, and in which a further doped region is provided intermediate the gate and the drain.

It is thus possible to reduce the field strength in the vicinity of the drain by providing the further doped region. The further doped region can be regarded as forming an intermediate drain.

Preferably the semiconductor region of the first type is N-doped semiconductor, and any regions of a second type are P doped semiconductor. However these doping or conductivity types may be reversed.

In a preferred embodiment the intermediate drain is not connected to any device terminals, nor tied in voltage to any other regions of the device, thereby allowing it to float to or otherwise attain a potential intermediate the drain and source voltages. Thus the fraction of the drain voltage that the intermediate drain achieves may be controlled by varying the spacing of the intermediate region from the drain (its position between the drain and gate), and/or its width.

According to a second aspect of the present invention there is provided a method of forming a field effect transistor, comprising the steps of doping a region of semiconductor to form a source, a drain and a channel, and wherein a further doped region is formed intermediate the drain and the channel.

According to a third aspect of the present invention there is provided a field effect transistor having a source region, and first and second drain regions, where the second drain region is intermediate the first drain region and the source region.

BRIEF DESCRIPTION OF THE DRAWINGS

The present invention will now be described, by way of non-limiting example only, with reference to the accompanying drawings, in which.

DETAILED DESCRIPTION OF PREFERRED EMBODIMENTS

Figure 1:
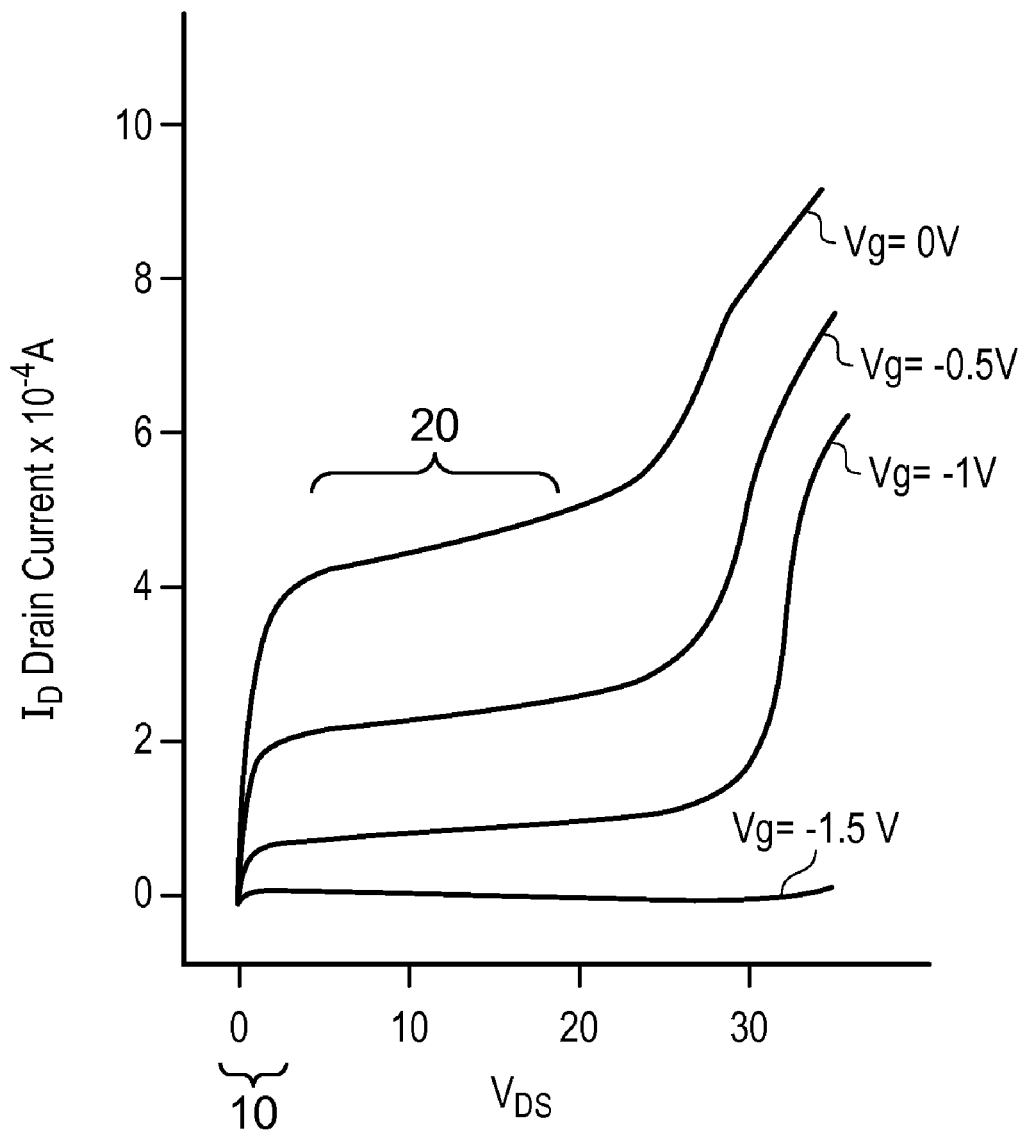
FIG. 1 is a plot of drain current versus drain-source voltage for an exemplary junction field effect transistor.

It is common to look at device characteristics for example as shown in FIG. 1, where a drain current $I_d$ of a JFET is plotted as a function of the drain-source voltage $V_{DS}$ for various gate voltages $V_G$. As can be seen, for small $V_{DS}$ the drain current $I_d$ rises rapidly in what is known as the "triode" region, generally indicated 10, where the device functions like a voltage controlled resistor. However, as $V_{DS}$ increases the transistor enters into the "pinch off" region, generally designated 20, where ideally the $I_d$ versus $V_{DS}$ characteristics would be horizontal so that the current was exclusively controlled by the gate voltage (this region of operation is also known as the "linear" region or mode), but in reality they have some gradient because the transistor is not able to function as an ideal constant current source. As the drain-source voltage increases still further then breakdown processes cause the drain current to rise more rapidly again in response to increasing $V_{DS}$.

Figure 2:
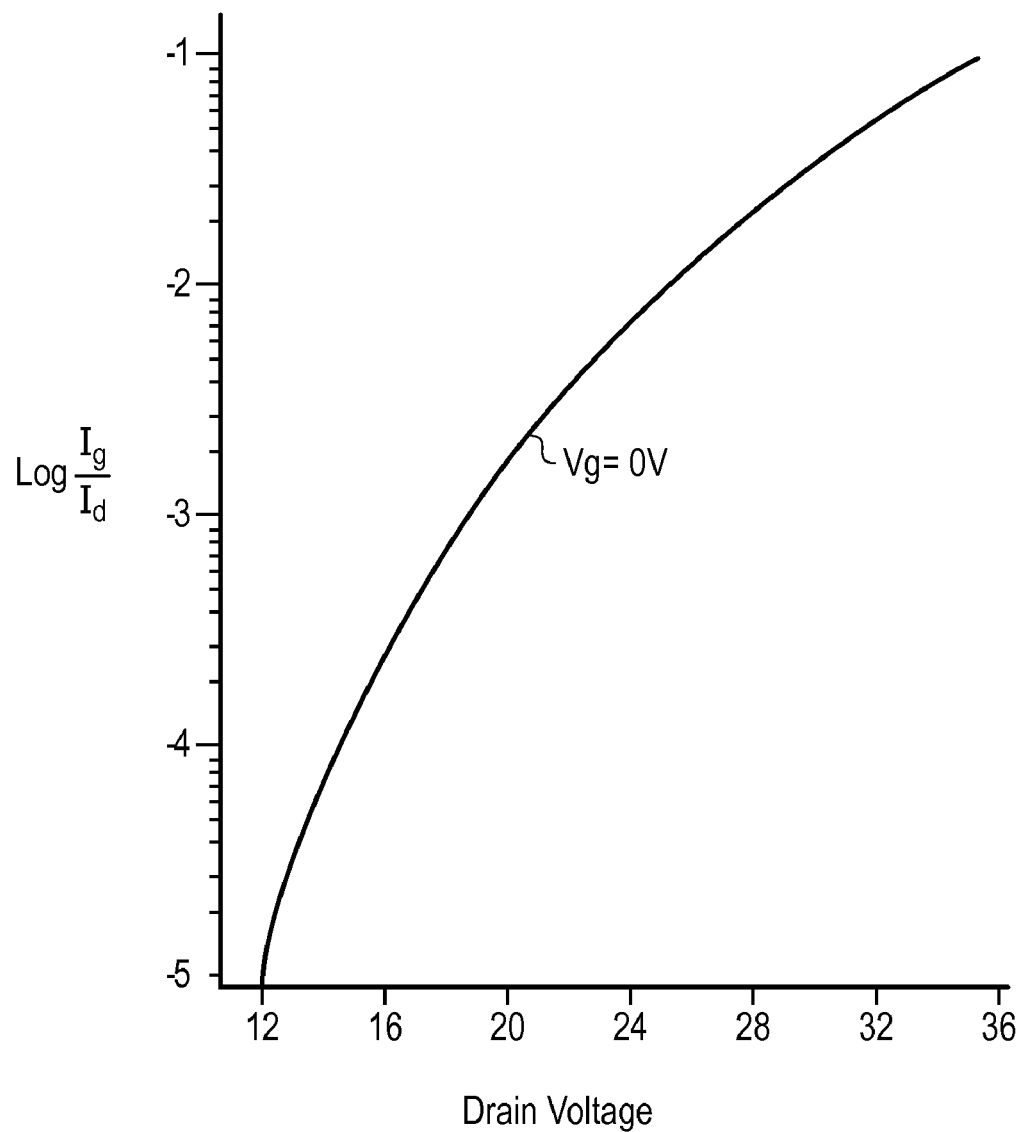
FIG. 2 is a logarithmic plot of the ratio of gate current to drain current as a function of fixed drain voltage for the exemplary transistor.

However, it is not so common to consider the gate current $I_g$. FIG. 2 plots the ratio of the gate current to the drain current, on a logarithmic scale, versus drain source voltage $V_{DS}$ for the same device as was characterized in FIG. 1, as the voltage is swept from 12 to 36 volts. It can be seen, with a gate voltage $V_G$=0 (and the source held at 0V) the gate current is less than one ten thousandth of the drain current at 14 volts drain-source voltage, but as $V_{DS}$ rises then the ratio $I_g/I_d$ rises until at $V_{DS}$=36 V the gate current $I_d$ has risen to 10% of $I_g$. This is undesirable.

It can be difficult for device and/or circuit designers to ensure that the transistor will not be subjected to large $V_{DS}$ voltages. This might occur because the JFET is at an input stage of an amplifier and the amplifier designer has no control over, or even knowledge of, the circuit or components preceding the amplifier.

Thus there is a desire to reduce the gate current that the JFET draws, even when subjected to large $V_{DS}$.

Figure 3:
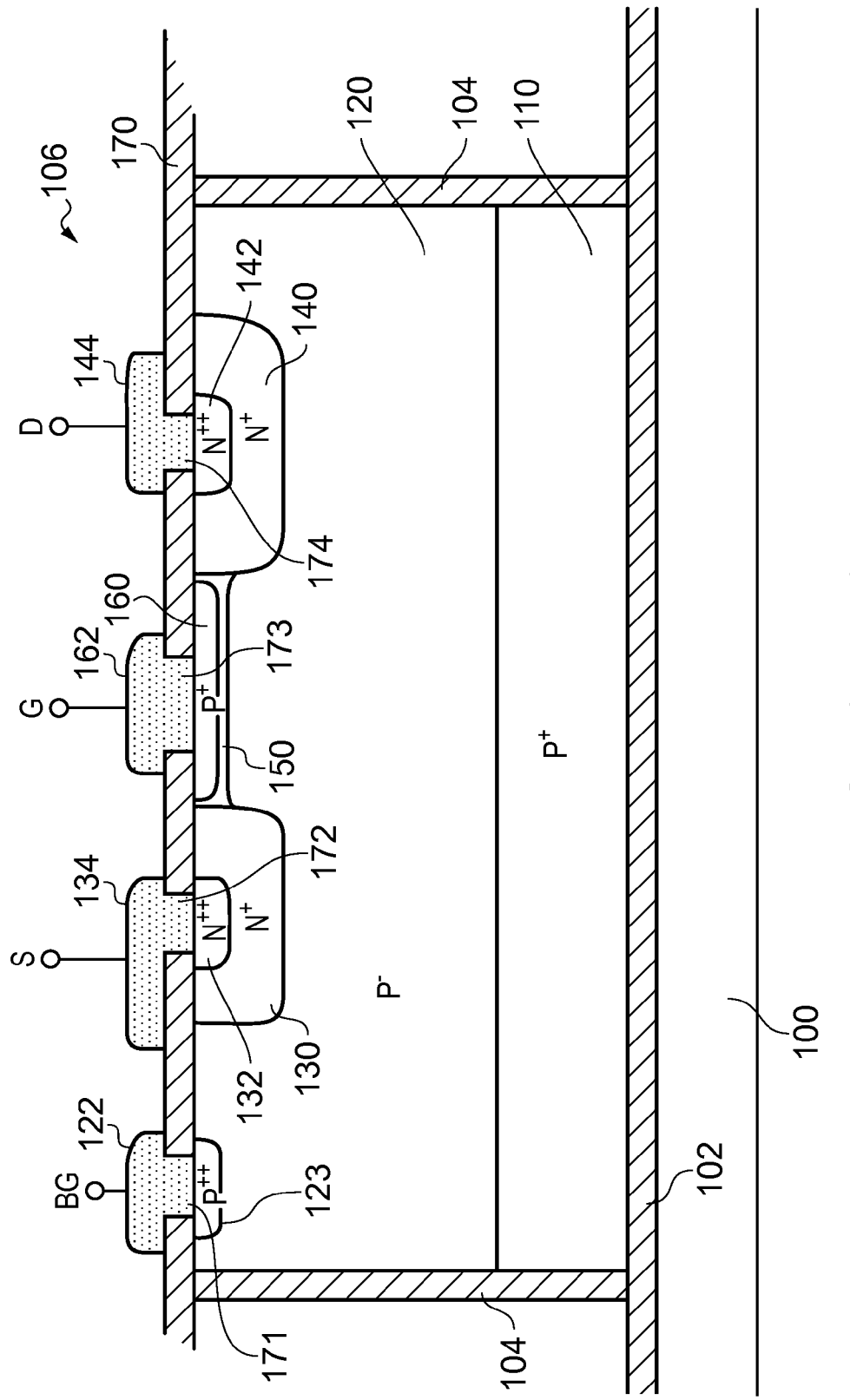
FIG. 3 is a schematic cross section of a prior art junction field effect transistor.

The increase in gate current is due to the impact ionization occurring within the device. In order to consider the impact ionization mechanism further it is worth reminding ourselves of the structure of a typical n channel JFET device. Such a device is shown in FIG. 3. In this description we are considering a single transistor, but it is to be understood that the transistor may only be one of many in an integrated circuit.

Terms such as above, below, over and so on as used herein refer to a device orientated as shown in the figures and should be construed accordingly. It should also be appreciated that because regions within a transistor are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader.

The device shown in FIG. 3 is a silicon on insulator (SOI) isolated well device. As such the device sits in its own "island" of semiconductor material, generally designated 106, which is formed in a well of insulation and is insulated from all other devices on the integrated circuit. In this embodiment a handle wafer 100 acts as a carrier substrate and has an insulating layer of silicon dioxide 102 formed thereon.

Side walls 104 (which also exist above and below the plane of the drawing) are also formed (typically of silicon dioxide) so as to isolate the island of silicon 106 in a well formed by layer 102 and walls 104, and the insulating walls running above and below the plane of the drawing and parallel to it. The process for forming the layer 102 and walls 104 is a standard fabrication process and need not be described here. In other arrangements, the well of semiconductor material can be junction isolated.

When forming an n-channel FET the island 106 of silicon usually comprises a bottom layer 110 of $P^+$ type semiconductor (i.e., quite heavily doped P-type semiconductor material, where the acceptor dopant is typically Boron) because this is a standard offering from semiconductor foundries that offer bipolar transistors, as the $P^+$ layer is often beneficial in the operation of PNP bipolar transistors. This layer 110 could be omitted.

A further P-doped layer 120 is formed above layer 110. This is deposited as an epilaxial layer and is often quite lightly doped ($P^-$). The layer 120 has a contact 122 formed at its surface so that it may act as the back gate of the JFET. An interface region 123 may be provided as a very heavily doped region, designated $P^{++}$ in the Figures. Source and drain regions 130 and 140, respectively, are formed by doping the semiconductor material with $N^+$ type material. The donor dopant is typically phosphorous (though other N-type dopants can be used) and the doping level is quite high, typically around $10^{17}$ atoms per cm$^3$. Regions of even higher doping 132 and 142 are provided to form contact regions with metal conductors 134 and 144, respectively. These regions are often Arsenic doped. A channel region 150 is provided which is also N doped, but at a lesser concentration, such as around one third ($3\times10^{16}$ atoms per cm$^3$) of the concentration of the source and drain. A gate 160 formed of a thin layer of the P-type material (typically Boron doped) is formed above the channel 150 and connected to a gate electrode 162, as illustrated. The interface between the gate electrode 162 and the gate 160 may be via a heavily doped $P^{++}$ region so as to avoid forming a Schottky contact. Alternatively, and just as validly the gate electrode 162 can be omitted, and the gate region 160 can extend out of the plane of the drawing to connect with the back gate layer 120. Thus the back gate 120 and the gate 160 are the same region of semiconductor material. This constructional change does not alter the discussion about the way the device works.

A layer of insulator 170 is formed over the device, with through holes 171, 172, 173 (if a discrete gate connection is provided) and 174 to enable the metal conductors to contact the back gate, source, gate and drain regions respectively.

In the completed device the gate electrode 162 (also known as the top gate) is generally connected to the back gate electrode 122, or as mentioned above, the gate 160 may actually be the same region as the back gate layer 120. Both configurations electrically connect the gate and back gate.

During fabrication the N type layer that forms the channel 150 may be formed, for example, as a stripe of the N type extending between regions that will eventually form the source and drain regions 130, 140. The $P^+$ type region that forms the gate 160 may then be formed by a further implantation step, such that in this example the N type channel region 150 is enclosed by the P type gate and back gate regions 160 and 120. Further masking and doping steps can then be used to define the regions where the source and drain are regions are formed, such that a continuous conductive path through N type material exists between the drain to the source via the channel.

Figure 4:
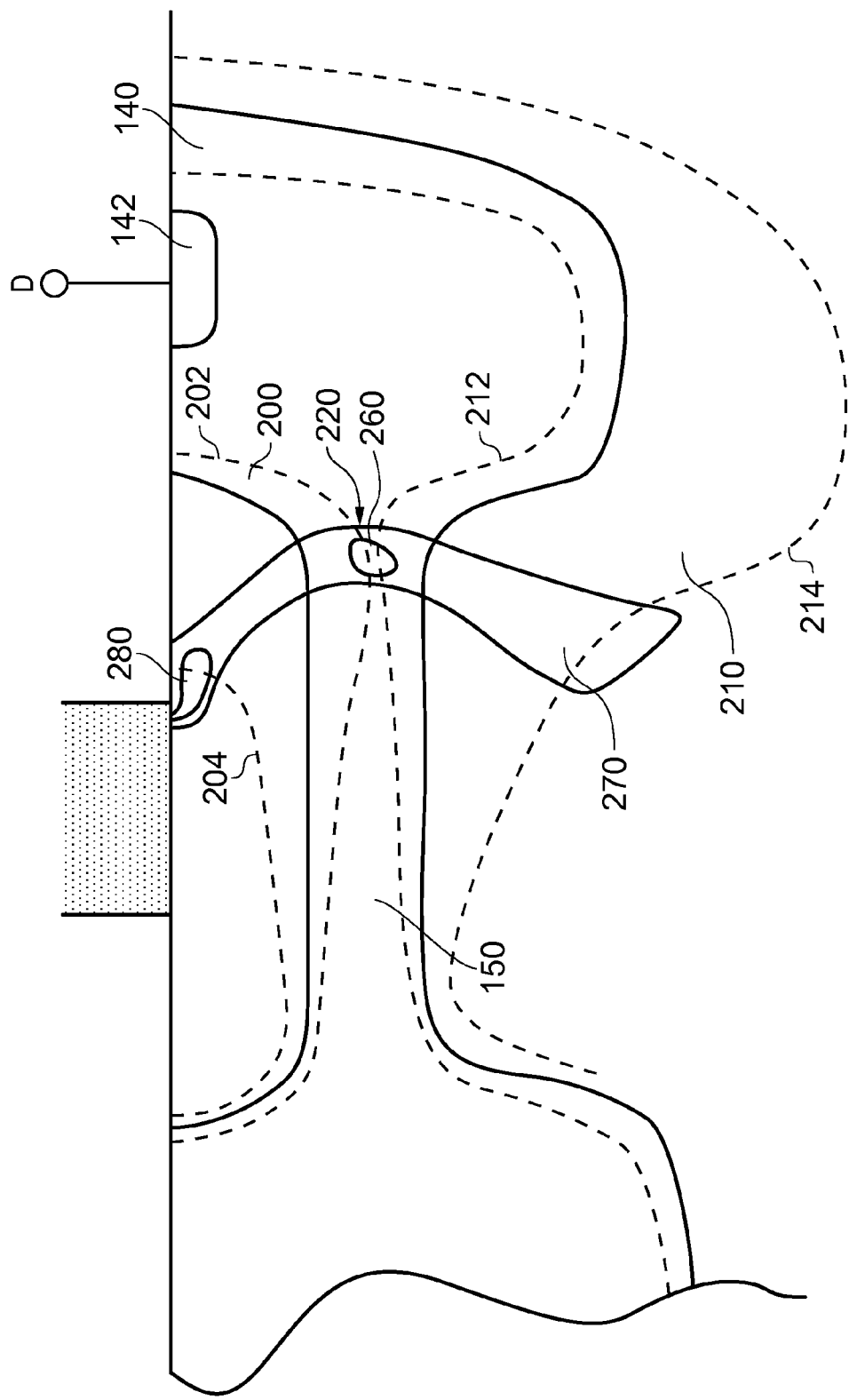
FIG. 4 schematically illustrates the extent of the depletion layer in the device shown in FIG. 3 at a drain voltage of 36 Volts.

In use the drain current flows from the source 130 to the drain 140 along the channel 150. The effective depth of the channel varies with distance from the source 130 to the drain 140, as shown in FIG. 4, because of the existence of a first depletion region 200, notionally delimited by broken lines 202 and 204, and a second depletion region 210 notionally delimited by broken lines 212 and 214, due to the applied voltage as is well known to the person skilled in the art.

However once a FET has reached its linear mode, i.e., pinch off has occurred, the pinch off occurs near the drain 140 of the transistor and results in most, but not all, of the channel around the pinched off section being in the depletion region and hence being non-conducting. The current flow is concentrated in the remaining conducting portion, generally designated 220, of the channel 150 that exists between the depletion regions. It also follows that the electric field gradients are highest at this region of the channel. FIG. 4 also shows calculated current densities in a device with $V_{DS}$=36 Volts, but these should be considered in conjunction with FIG. 5.

Figure 5:
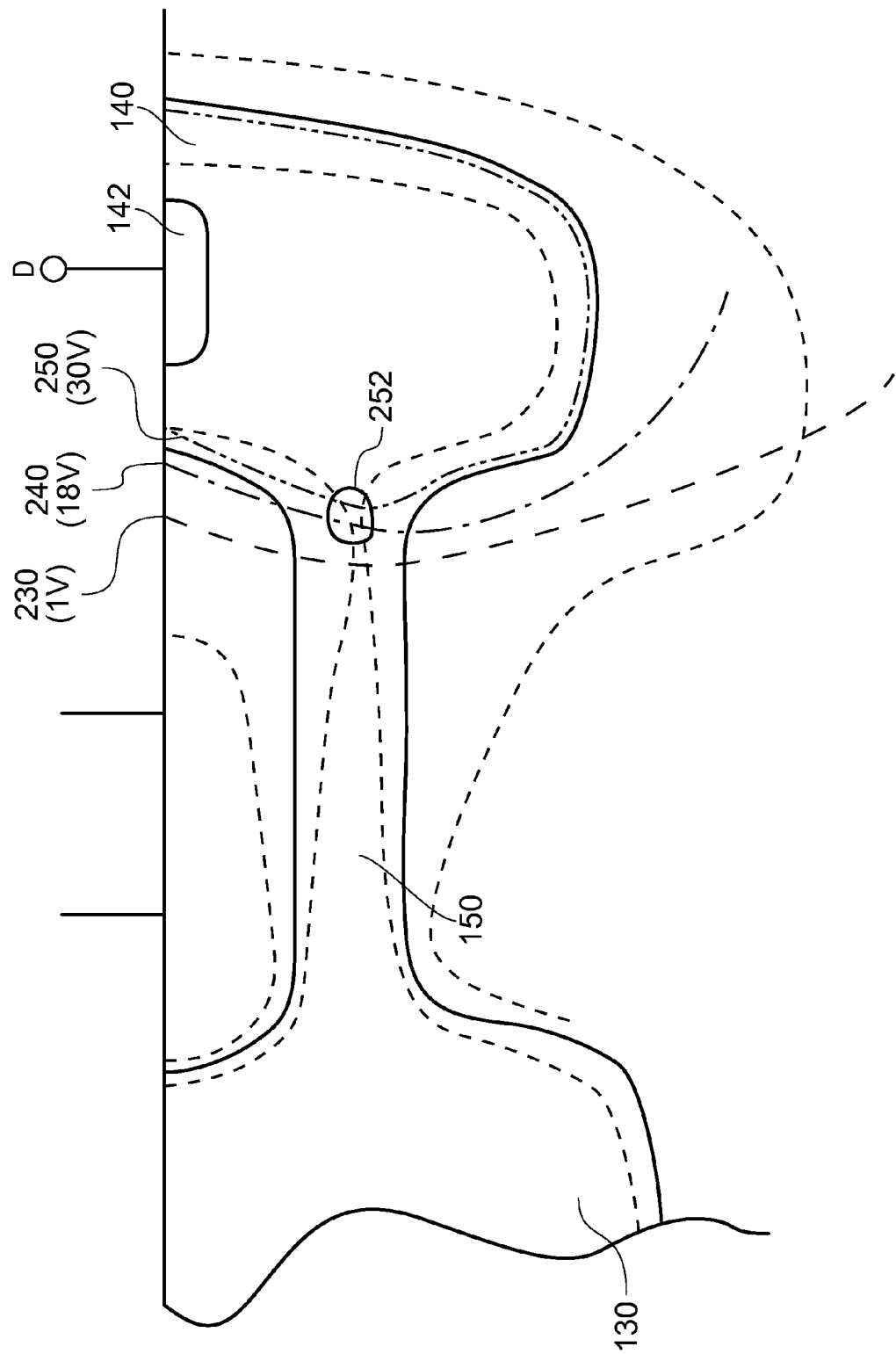
FIG. 5 schematically shows equi-potentials within the device shown in FIG. 3 at a drain voltage of 36 volts.

The potential gradient varies significantly within the device. FIG. 5 shows simulated potentials (i.e., voltage) within the device shown in FIG. 4. The boundaries of the depletion layers are also shown, as they were in FIG. 4. Lines of equi-potential are also illustrated. For this device, where 36 volts is applied to the drain terminal and the gate is at −4V, most of the device is below 1V (i.e., to the left of line 230). The voltage starts to change rapidly towards the pinched off region 220 (FIG. 4) of the channel, as shown by the closeness of the line of equi-potential 240 representing a potential of 18 volts, and the line 250 representing a potential of 30 volts. This it can be seen that the bulk of the voltage across the device is dropped across a small distance, generally designated 252, near the edge of the drain 140.

Returning to FIG. 4 we see the strongest region of voltage change coincides with the highest region of current density, as denoted by region 260. This give rise to impact ionization of atoms in this region 260 due to the combination of high current densities (possibly in the vicinity of 100 A cm$^{-2}$) and the strongest electric field gradients. This impact ionization rips carriers from the atoms and gives rise to an additional current flow in region 270, which concentrates towards the edge of the gate to give rise to further region 280 where additional impact ionization occurs. This gives rise to a device generated gate current flow. This device generated gate current flow is the reason that the gate current rises so significantly as the drain voltage rises.

The inventors realized that controlling the onset of impact ionization around the pinch off region of the channel would not only improve the transistor breakdown voltage, but would also reduce the gate current. This significantly enhances the effective input impedance of the device, thereby increasing its utility.

In accordance with an embodiment, the inclusion of an additional structure intermediate the drain and the gate can reduce the electric field gradients around the edge of the drain and hence could reduce the amount of impact ionization, and in turn reduce the gate current.

Figure 6:
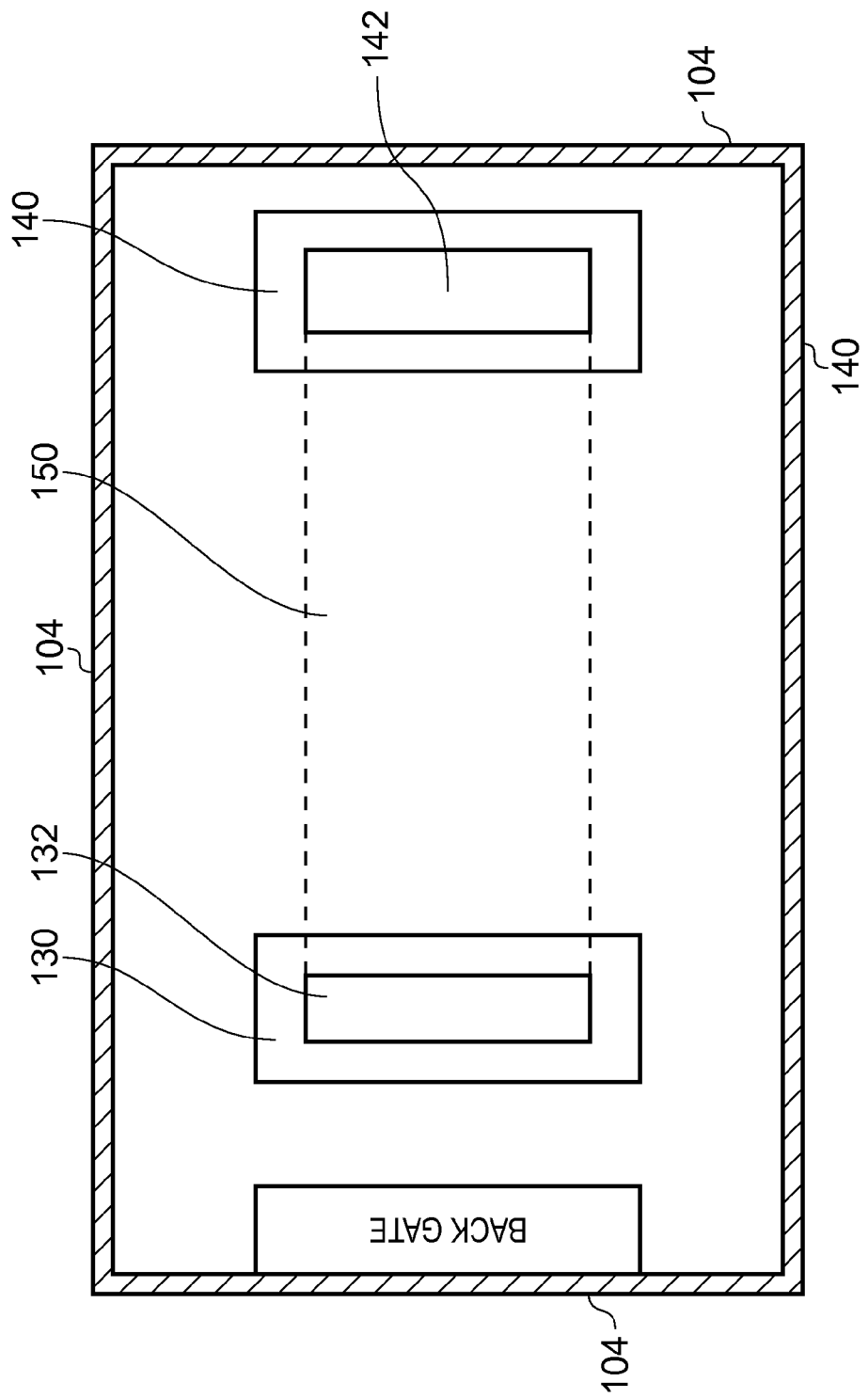
FIG. 6 is a schematic plan view of the transistor shown in FIG. 3.
Figure 7:
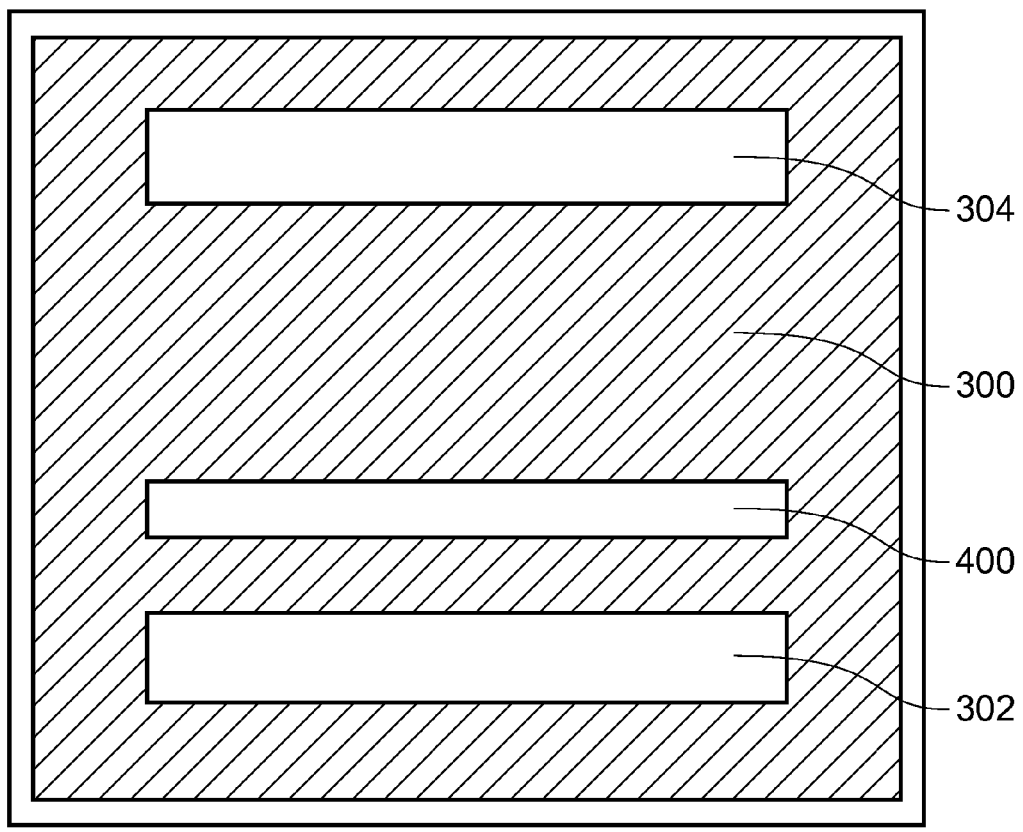
FIG. 7 is a plan view of a mask used to define the spatial extent of doping during the doping of the source, drain and intermediate drain regions for a transistor in accordance with an embodiment of the present invention.

FIG. 6 shows, in plan view, some of the semiconductor regions of a horizontally formed JFET of the type illustrated in FIG. 3. The channel 150 is shown in outline as it exists below the upper surface of the transistor. A region of semiconductor material forms the gate, and extends on either side of the channel where it joins the region 120 (see FIG. 3) that forms the back gate. Thus the gate and the back gate can be treated, electrically, as one and the same. The oxide layer and electrical contacts above the surface of the transistor have been omitted for clarity. During fabrication of the source and drain regions 130 and 140, a mask is deposited on the surface of the semiconductor material or substrate with apertures in the mask occurring where the drain and source, respectively, are to be formed—these apertures roughly correspond in location to slots 302 and 304, shown in FIG. 7, which will be described in more detail below.

Thus, in the transistor shown in FIG. 6, connections need only be made to the source region 130, the drain region 140 and the back gate 104 in order to connect to the transistor.

In a modification of the fabrication process in accordance with an embodiment of the present invention, a mask 300 for doping transistor source and drain regions is modified to include an additional aperture 400 adjacent aperture 302, which defines the drain, and on the side thereof which faces towards the source and the channel of the transistor.

Figure 8:
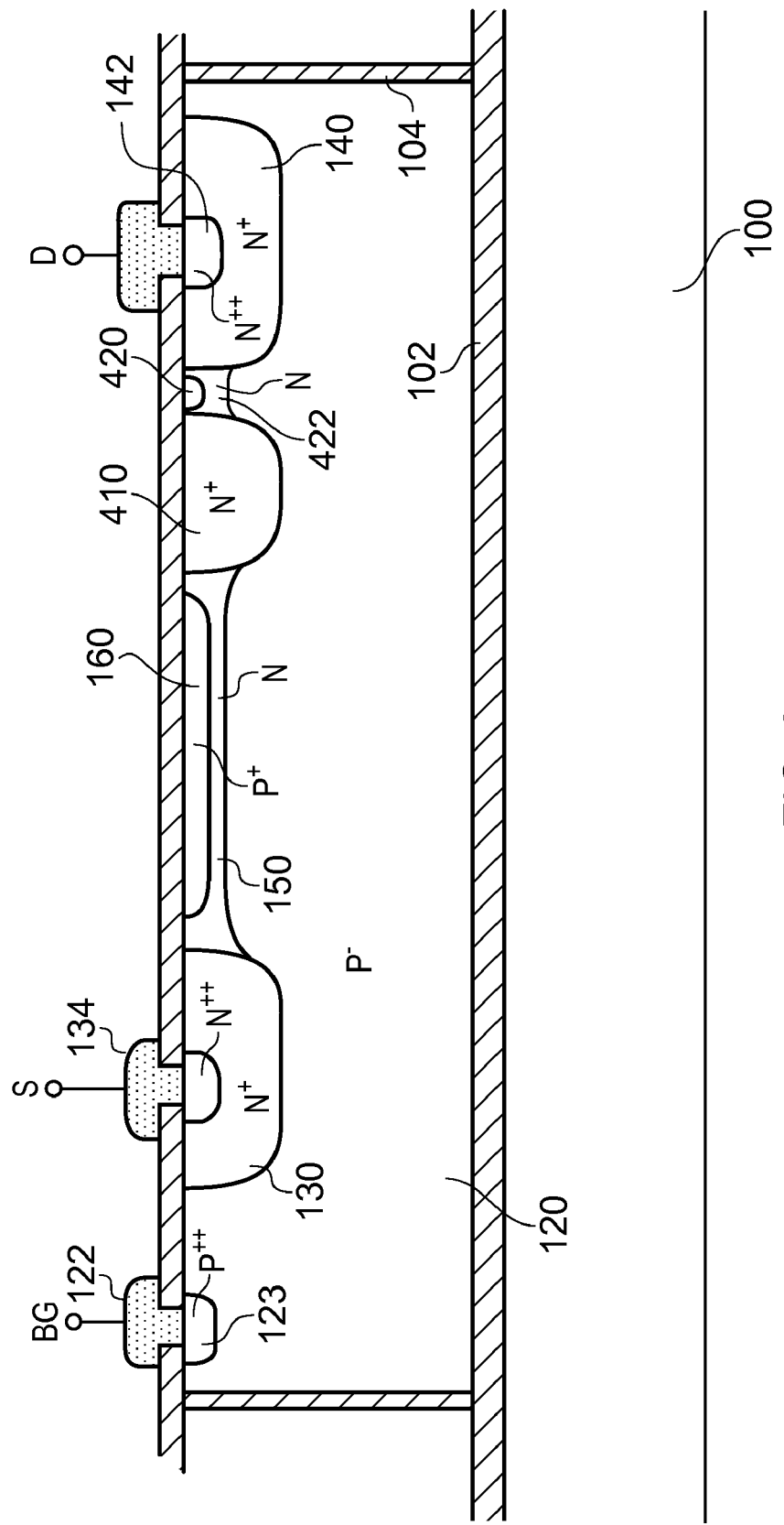
FIG. 8 shows, in schematic cross section, the structure of a transistor in accordance with an embodiment of the present invention.

Thus, during the doping step, the N type dopant is simultaneously implanted or otherwise provided into the semiconductor material (usually silicon) beneath the apertures 302, 304 and 400 in the mask 300, thereby simultaneously doping the source, drain and additional drain regions. This gives rise to a modified device structure, as shown in FIG. 8, which can be compared with that of FIG. 3. Like reference numerals have been used to designate like parts in FIGS. 3 and 8. Optionally the P$^+$layer 110 can be omitted, as illustrated in FIG. 8, or indeed can be provided as shown in FIG. 3. However the most significant difference is the formation of the further N$^+$region 410 intermediate the drain 140 and the channel 150 of the transistor. The regions 410 and 140 are both heavily doped so that the conductivity in those regions is quite good. However they are separated from each other by a region of reduced doping 422 which therefore has reduced conductivity. As a result the region 410 floats to an intermediate voltage between the drain voltage and the source voltage.

The additional region or intermediate drain 410 is in effect a second drain that is implanted into part of the channel of the transistor, between the source 130 and the "normal" or first drain 140. As shown, closer to the drain 140 than to the source 130 but spaced from the drain 140. Thus a P$^+$ region 420 and a lightly doped N region 422 intervenes between the two N$^+$ regions 140 and 410. The intermediate drain 410 is also between or intermediate the main or major parts of the gate 160 and channel 150 and the drain 140. When formed with the mask 300 of FIG. 7, the conductivity or dopant type and concentration is the same for both the intermediate drain 410 and the drain 140, and also the same for the source 130. Thus the same impurity (e.g., phosphorus) can be found in both the intermediate drain 410 and the drain 140.

Alternatively, if desired, separate masking and implantation steps could be used to form the additional region 410 which has been formed in the channel between the source and the drain regions.

As explained with respect to FIG. 3, the gate region 160 extends above and below the plane of the figure such that the back gate connection 122 serves as the gate terminal in the illustrated embodiment. Alternatively, a gate terminal 162 (FIG. 3) can be provided).

The additional drain 410 is implanted at such a distance from the drain that diffusion of the dopant during a thermal diffusion step is not sufficient to cause the two N$^+$ regions to merge with one another. Thus the edge of the additional implantation 410 can be regarded as being separated from the edge of the drain 140 by more then the diffusion distance of the impurity during the remainder of thermal processing for the integrated circuit.

Figure 9:
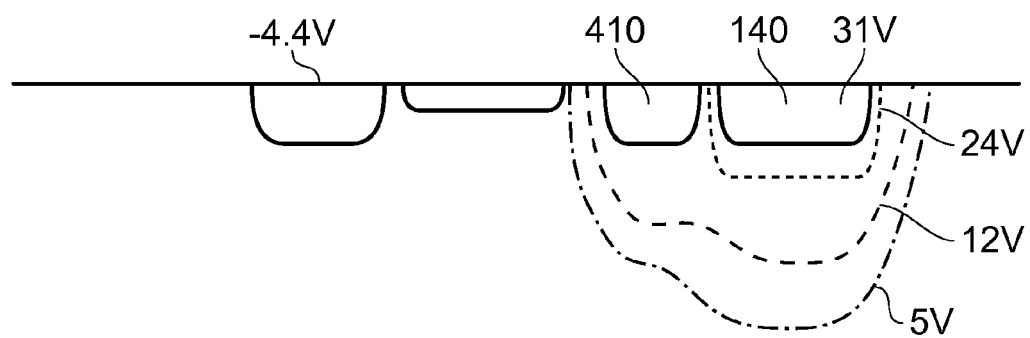
FIG. 9 is a plot of equipotentials for the transistor at FIG. 8 when in use at an exemplary high voltage.

FIG. 9 schematically shows a simulation of electrostatic potentials within the device shown in FIG. 8, where the source is connected to minus 4.4 volts and the drain is connected to a voltage +31 volts. The figure includes lines of equi-potential showing a 24 volt equi-potential, 12 volt equi-potential and 5 volt equi-potential. It can be seen that the intermediate drain 410 sits at a potential that is between 12 volts and 24 volts, and in this example is somewhere around 18 volts. This reduces the electric field gradient at the edge of the channel. Thus, the electric field gradient is reduced in those regions of highest current density (compared with FIG. 4) and hence impact ionization is significantly reduced by the inclusion of the intermediate drain 410.

Figure 10:
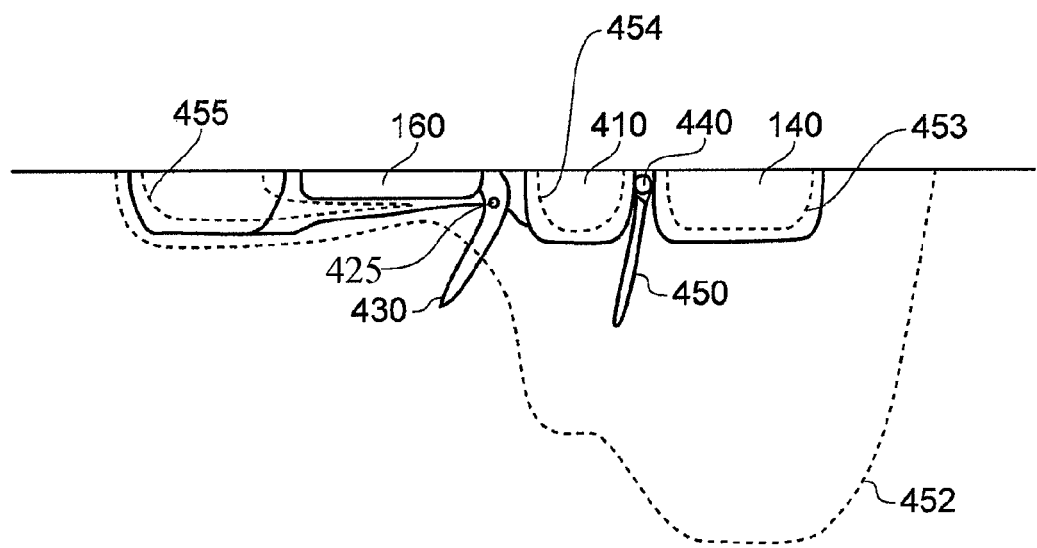
FIG. 10 schematically shows current density and depletion region boundaries for the transistor of FIG. 8 when in use at an exemplary high voltage.

Put another way, regions of high current density still exist, as shown in FIG. 10, but they no longer coincide with those regions of the semiconductor material which experience the highest electric field gradients. Hence, as shown in FIG. 10, a region 425 of relatively high current density (around 6 amps per square centimeter) exists at the end of the channel region, and is equivalent to the region 260 shown in FIG. 4. It sits within a finger of relatively high but reduced current density 430 (around 2 amps per square centimeter) which roughly corresponds to the region 270 of FIG. 4. However, we now see additional regions of high current density 450 between the drain 142 and the intermediate drain 410. Thus, whilst region 440 has a current density approaching 10 amps per square centimeter and the region 450 has a current density of around 4 to 6 amps per square centimeter, these densities occur in regions where the electric field gradient is much reduced. Thus the enhanced current density does not give rise to significant amounts of impact ionization.

FIG. 10 also shows the edges of the depletion regions as broken lines. Thus a depletion region boundary 452 exists in the bulk of the semiconductor used to form the transistor.

Depletion regions boundaries 453 and 454 also exist in the drain 140 and intermediate drain 410. Finally broken line 455 represents the edge of the depletion region extending from the source.

In use, the voltage of the intermediate drain is, at low $V_{DS}$, defined primarily by the resistive drop in voltage along the portion of the channel that connects the intermediate drain to the drain. As the voltage across the transistor increases the voltage drop becomes primarily defined by the spatial extent of the depletion regions.

Figures 11A, 11B:
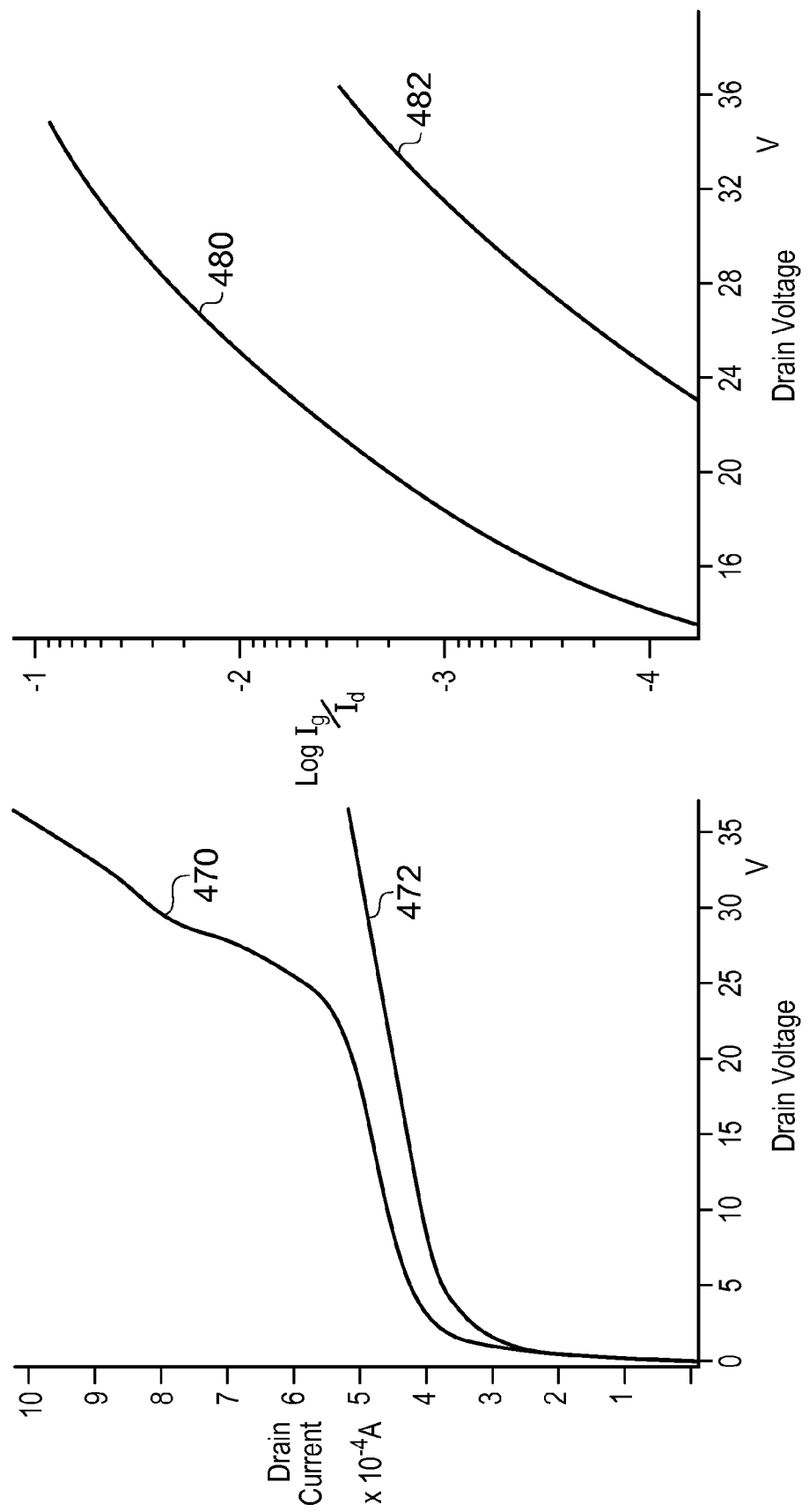
FIGS. 11a and 11b show drain current versus drain voltage and a ratio of gate current to drain current as a function of drain voltage for a prior art transistor and a transistor according to an embodiment of the present invention.

FIGS. 11a and 11b compare the relative performances of a prior art transistor and a transistor in accordance with an embodiment of the present invention. In FIG. 11a drain current was measured for a transistor whose source and gate voltages were held constant as the drain voltage was increased. The performance of the prior art device is designated by line 470 whereas the performance of a transistor in accordance with an embodiment of the invention is designated by line 472. It can be seen that for drain voltages up to 20 volts the drain current in the embodiment of the invention is slightly less than that at the prior art transistor, but significantly as the drain voltage increases past 25 volts the performance of the transistor constituting an embodiment of the invention remains predictable and linear, whereas the prior art transistor begins to suffer from breakdown. FIG. 11b compares the ratio of the gate current to the drain current for a prior art transistor and a transistor constituting an embodiment of the present invention, as represented by lines 480 and 482, respectively. It can be seen that, for example, at a drain voltage of 28 volts the transistor formed in accordance with the embodiment of the present invention has a gate current which less than 2% and in fact roughly 100 times less that of the gate current of the prior art transistor at any drain voltage in the operational range.

This result is repeated across a range of test devices made by the applicant.

This demonstrates that the formation of the intermediate drain region provides a reduction in the gate current by approximately two orders of magnitude whilst having negligible impact on other characteristics of the device.

In testing a 60 μm by 10 μm N type JFET was formed with the edge-to-edge spacing or separation between the drain and intermediate drain being 4 μm as defined by the doping mask. This distance is only given by way of example and other separations are possible. In the embodiment, drain and the intermediate drain do not merge, such that regions with similar doping characteristics as the channel intervene between the drain and the intermediate drain. Preferably the separation between the drain and intermediate drain is at least twice the diffusion length, such that if the dopant drive step diffuses dopants by 1.5 μm, the minimum separation is preferably 3 μm. An exemplary range of spacing for a 30-40 volt NJFET is about 3 μm to 5 μm.

Formation of the intermediate drain during the same step as formation of the drain is relatively easy as, as noted before, an additional aperture can be provided in the same mask that defines the implantation of the drain and source. The size and shape of the aperture is relatively easy to control and does not have to be defined with high precision. As a consequence, this modification does not require an additional mask relative to prior art methods, is inexpensive to implement and is not particularly sensitive to process variations.

Figure 12:
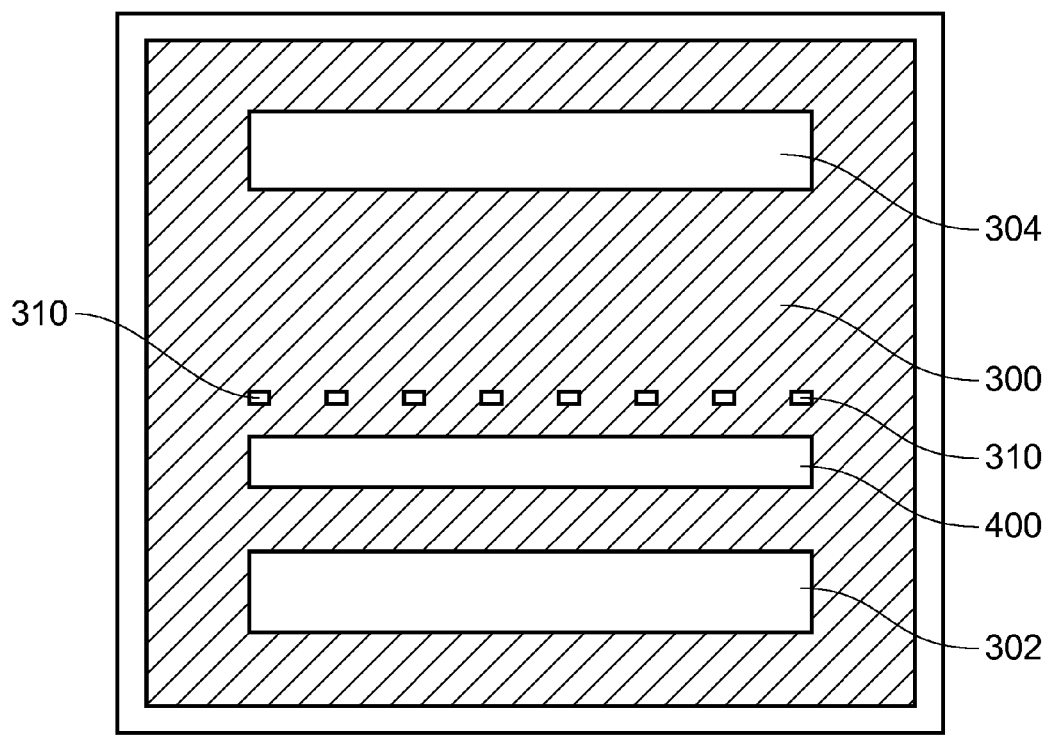
FIG. 12 shows a modified mask for use in accordance with an embodiment.

In a further variation it is possible to modify the doping profile of the edges of the drain or the intermediate drain such that the doping concentration becomes reduced over an extended area. This reduces the abruptness of the edge of the drain or the intermediate drain meaning that changes in field gradient are smeared out. This gives a further reduction of field gradients in the vicinity of, for example, the pinch off region at the end of the channel, giving rise to a further reduction in impact ionization in this region. As shown in FIG. 12, this tapering of the dopant can be achieved by providing additional apertures 310 adjacent to the aperture 302 for the drain and/or adjacent the aperture 400 for the intermediate drain (as shown) facing the channel of the field effect transistor. In one example, the apertures 310 can be nominally about 1 micron square having a center displaced by about 1.5 microns from the edge of the drain aperture 302 or the intermediate drain aperture 400.

These extra diffusions need not be limited to squares and can be formed using any shape that gives a modification to the dopant profile. Circles of varying sizes, lines or multiple lines of different widths or separations could be used.

Although the second drain or intermediate drain has hitherto been described as being isolated, in that no external connection is made to it as illustrated because it is covered by a layer of insulation, it is possible modify the transistor to form a connection to the second drain. The second drain can then be connected to a circuit that may actively control the voltage of the second drain, whilst advantageously not sinking any substantial amount of current out of the drain.

Transistors and methods for forming the same as described herein can be implemented in various electronic devices. Examples of the electronic devices can include high speed signal processing chips, power regulators, memory chips, memory modules, circuits of optical networks or other communication networks, and disk driver circuits. Products in which such electronics can be incorporated include, but are not limited to, consumer electronic products, parts of the consumer electronic products, electronic test equipments, etc. The consumer electronic products can include, but are not limited to, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

We claim:

1. An electronic device comprising a field effect transistor having a drain, a gate and a source, wherein the drain and source include semiconductor regions of a first type, and in which a further doped region of the first type is intermediate the gate and the drain, the further doped region separated from the drain at least in part by a semiconductor region of a second type and configured to float, the first type being opposite of the second type.

2. The device as claimed in claim 1, in which the further doped region is configured to float to a voltage intermediate a source voltage and a drain voltage.

3. The device as claimed in claim 1, in which the further doped region forms an intermediate drain region.

4. The device as claimed in claim 1, in which the gate includes a semiconductor material of the second type.

5. The device as claimed in claim 1, in which the transistor is a junction field effect transistor.

6. An electronic device comprising a field effect transistor having a drain, a gate, and a source, the drain and the source including semiconductor regions of a first type, wherein a further doped region of the field effect transistor is intermediate the gate and the drain, the further doped region separated from the drain and configured to float, and wherein at least one of the drain and the further doped region has a modified doping profile of reduced dopant concentration on a side thereof facing a channel of the field effect transistor.

7. The device as claimed in claim 1, in which the first type is an N type semiconductor.

8. The device as claimed in claim 1, wherein the field effect transistor is formed in one of a junction isolated well of semiconductor material and an insulated well of semiconductor material.

9. The device as claimed in claim 1, in which the drain and the further doped region are separated from each other by a portion of a channel of the transistor.

10. A field effect transistor comprising a source, a channel, a drain, and an intermediate drain of the same conductivity type as the drain, the intermediate drain disposed in the channel adjacent the drain and spaced from the drain at least in part by semiconductor material of the opposite conductivity type as the drain and the intermediate drain, wherein the intermediate drain is configured to float.

11. The field effect transistor as claimed in claim 10, in which the intermediate drain has substantially the same doping concentration as the drain.

12. A junction field effect transistor comprising a source region, first and second drain regions, and a gate region disposed between the first drain region and the source region, the junction field effect transistor being asymmetric about the gate between the first drain region and the source region, wherein the second drain region is intermediate and spaced from the first drain region and the source region, and wherein the second drain region is configured to float.

13. The junction field effect transistor as claimed in claim 12, where the second drain is configured to float to a voltage between a source voltage and a first drain voltage.

14. A field effect transistor comprising a source region, a first drain region, and a second drain region, the second drain region being intermediate and spaced from the first drain region and the source region, wherein a contact to the second drain region is configured to be driven by a circuit to a voltage intermediate that of the source and the first drain.

15. The device as claimed in claim 1, wherein the source and the drain are asymmetrically arranged about the gate.

16. The field effect transistor as claimed in claim 10, wherein the field effect transistor is a junction field effect transistor.

17. A field effect transistor comprising a source region, first and second drain regions, and a gate region disposed between the first drain region and the source region, the field effect transistor being asymmetric about the gate between the first drain region and the source region, wherein the second drain region is intermediate and spaced from the first drain region and the source region, wherein the second drain region is configured to float, wherein the first and second drain regions comprise semiconductor material of a first conductivity type, and wherein the first drain region is separated at least in part from the second drain region by semiconductor material of a second conductivity type, the first conductivity type being different from the second conductivity type.

18. The field effect transistor as claimed in claim 17, wherein the field effect transistor is a junction field effect transistor.

* * * * *